United States Patent
Miyashita et al.

(10) Patent No.: US 9,673,078 B2
(45) Date of Patent: Jun. 6, 2017

(54) COOLING PROCESSING APPARATUS AND METHOD FOR OPERATING THE SAME

(71) Applicant: TOKYO ELECTRON LIMITED, Tokyo (JP)

(72) Inventors: Tetsuya Miyashita, Nirasaki (JP); Masamichi Hara, Nirasaki (JP); Naoyuki Suzuki, Nirasaki (JP); Kaoru Yamamoto, Nirasaki (JP); Kouji Maeda, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 47 days.

(21) Appl. No.: 14/721,452

(22) Filed: May 26, 2015

(65) Prior Publication Data

US 2015/0357222 A1 Dec. 10, 2015

(30) Foreign Application Priority Data

Jun. 4, 2014 (JP) .................................. 2014-115566

(51) Int. Cl.
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67109* (2013.01); *H01L 21/67115* (2013.01); *H01L 21/6875* (2013.01)

(58) Field of Classification Search
CPC .................. H01L 21/6833; H01L 21/67109

USPC ......................................................... 361/234
See application file for complete search history.

(56) References Cited

U.S. PATENT DOCUMENTS

2012/0309191 A1* 12/2012 Miura ................. H01L 21/6719
                                                              438/655
2015/0348773 A1* 12/2015 Zhu ...................... C23C 14/0036
                                                              438/503

FOREIGN PATENT DOCUMENTS

| JP | 05-190133 A | 7/1993 |
| JP | 3265743 B2 | 3/1995 |
| KR | 10-2000-0035303 A | 10/2011 |
| KR | 10-2011-0117700 A | 10/2011 |

* cited by examiner

*Primary Examiner* — Scott Bauer
(74) *Attorney, Agent, or Firm* — Nath, Goldberg & Meyer; Jerald L. Meyer

(57) ABSTRACT

A cooling processing apparatus includes: a processing vessel; an electrostatic chuck installed in the processing vessel, the electrostatic chuck having a mounting surface on which an object to be processed is mounted; a cooling mechanism configured to cool the electrostatic chuck; and a lamp heating device configured to remove moisture attached to the mounting surface. Further, a method for operating the cooling processing apparatus includes: decompressing the space in the processing vessel by using the exhaust device; removing the moisture attached to the mounting surface of the electrostatic chuck by using the lamp heating device; and cooling the electrostatic chuck by using the cooling mechanism after the removal of the moisture performed by the lamp heating device is terminated.

11 Claims, 11 Drawing Sheets

COOLING PROCESSING APPARATUS AND METHOD FOR OPERATING THE SAME

CROSS-REFERENCE TO RELATED APPLICATION

This application claims the benefit of Japanese Patent Application No. 2014-115566, filed on Jun. 4, 2014, in the Japan Patent Office, the disclosure of which is incorporated herein in its entirety by reference.

TECHNICAL FIELD

The present disclosure relates to a cooling processing apparatus and a method for operating the cooling processing apparatus.

BACKGROUND

In manufacturing an electronic device, a variety of processes are performed on an object to be processed which is accommodated in a processing vessel of a processing apparatus. A cooling processing apparatus for cooling an object to be processed is used as a kind of processing apparatus. The cooling processing apparatus generally includes an electrostatic chuck, and thus the object to be processed is sucked to the electrostatic chuck by an electrostatic force.

An electrostatic chuck has a base, a first insulating layer, suction electrodes and a second insulating layer. The base is made of metal, and a flow channel through which a coolant flows is formed in the base. The first insulating layer is formed on the base. The suction electrodes are formed on the base via the first insulating layer. In addition, the second insulating layer is installed to cover the first insulating layer and the suction electrodes. If a voltage is applied to the suction electrodes of the electrostatic chuck, an electrostatic force is generated, and an object to be processed is sucked to the electrostatic chuck by the electrostatic force. As coolant flows through the flow channel, the electrostatic chuck is cooled, so that the object to be processed mounted on the electrostatic chuck is cooled.

Meanwhile, moisture inevitably exists in the processing vessel. If the moisture existing in the processing vessel is attached to the electrostatic chuck, the suction force of the electrostatic chuck may be decreased in some cases. If the moisture penetrates into the insulating layer of the electrostatic chuck, an electric discharge may be generated between the suction electrodes of the electrostatic chuck and the object to be processed or between the suction electrodes and the base. Therefore, it is required to reduce the moisture attached especially on a mounting surface of the electrostatic chuck on which the object to be processed is mounted.

SUMMARY

According to one embodiment of the present disclosure, there is provided a cooling processing apparatus, including: a processing vessel; an electrostatic chuck installed in the processing vessel, the electrostatic chuck having a mounting surface on which an object to be processed is mounted; a cooling mechanism configured to cool the electrostatic chuck; and a lamp heating device configured to remove moisture attached to the mounting surface.

According to another embodiment of the present disclosure, there is provided a method for operating the cooling processing apparatus as described above, the method including: decompressing the space in the processing vessel by using the exhaust device; removing the moisture attached to the mounting surface of the electrostatic chuck by using the lamp heating device; and cooling the electrostatic chuck by using the cooling mechanism after the removal of the moisture performed by the lamp heating device is terminated.

According to another embodiment of the present disclosure, there is provided a method for operating the cooling processing apparatus as described above, the method including: stopping the cooling performed by the cooling mechanism in the state in which the space in the processing vessel is decompressed by the exhaust device; and heating the mounting surface of the electrostatic chuck by using the lamp heating device after the cooling performed by the cooling mechanism is stopped.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
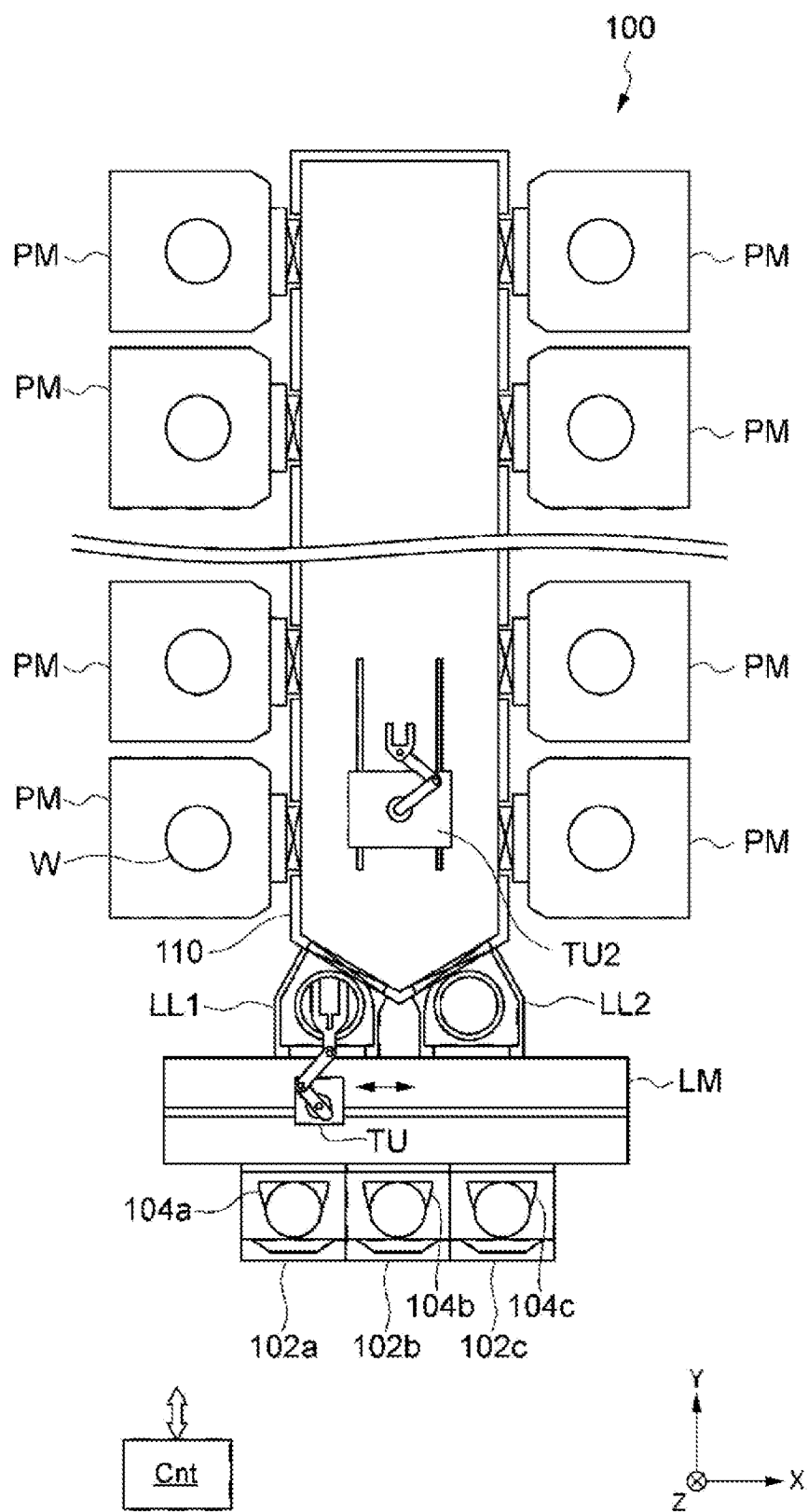
FIG. 1 is a view schematically illustrating a processing system according to an embodiment.

Hereinafter, various embodiments will be described in detail with reference to the accompanying drawings. In addition, like or corresponding parts in the respective drawings will be assigned like reference numerals. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a processing system according to an embodiment will be described. FIG. 1 is a view schematically illustrating a processing system according to an embodiment. The processing system 100 shown in FIG. 1 is a system for processing an object to be processed (hereinafter, referred to as a "wafer W"). The processing system 100 includes mounting tables 102a to 102c, accommodation vessels 104a to 104c, a loader module LM, load lock chambers LL1 and LL2, a plurality of process modules PM, and a transfer chamber 110.

The mounting tables 102a to 102c are arranged along the loader module LM. In the embodiment shown, the mounting tables 102a to 102c are arranged in the X direction along an edge of one side of the loader module LM, i.e., an edge of one side in the Y direction. The accommodation vessels 104a to 104c are mounted on the mounting tables 102a to 102c, respectively. The accommodation vessels 104a to 104c receive wafers W.

In an embodiment, the loader module LM has a generally box-like shape of which the length in the X direction is longer than that in the Y direction. The loader module LM has a chamber wall, and a transfer space in an atmospheric pressure is provided inside the chamber wall. The loader module LM has a transfer unit TU in this transfer space. The transfer unit TU of the loader module LM takes a wafer W out of an accommodation vessel selected among the accommodation vessels 104a to 104c, and transfers the taken wafer W to any one of the load lock chambers LL1 and LL2.

The load lock chambers LL1 and LL2 are arranged in the X direction along an edge of the other side in the Y direction of the loader module LM. A transfer chamber 110 is provided at the other side in the Y direction of the loader module LM. As shown in FIG. 1, the load lock chambers LL1 and LL2 are provided between the loader module LM and the transfer chamber 110. Gate valves are installed between the load lock chamber LL1 and the loader module LM, between the load lock chamber LL1 and the transfer chamber 110, between the load lock chamber LL2 and the loader module LM, and between the load lock chamber LL2 and the transfer chamber 110, respectively.

The load lock chambers LL1 and LL2 provide preliminary decompression chambers. Before transferred to the transfer chamber 110, a wafer W is transferred to the load lock chamber LL1 or LL2 and placed under a decompressed environment from an atmospheric pressure environment.

The transfer chamber 110 provides a decompressable transfer space. In an embodiment, this transfer space extends in the Y direction. The transfer chamber 110 has a transfer unit TU2 in the transfer space. The transfer unit TU2 transfers a wafer W in the Y direction in the transfer space. The transfer unit TU2 also transfers the wafer W to any one of the plurality of process modules PM. Gate valves are provided between the transfer chamber 110 and the respective process modules PM.

In the embodiment shown in FIG. 1, some of the process modules PM are arranged in the Y direction along an edge of one side in the X direction of the transfer chamber 110. The other process modules PM are arranged in the Y direction along an edge of the other side in the X direction of the transfer chamber 110. Each of the plurality of process modules PM processes the wafer W accommodated therein. For example, each of the plurality of process modules PM performs an exclusive process for the corresponding process module among various processes such as a physical vapor growth process, a pre-processing cleaning process, a heating process and a cooling process.

In the processing system 100 of the embodiment shown in FIG. 1, a wafer W accommodated in any one of the accommodation vessels 104a to 104c is transferred to any one of the plurality of process modules PM through the loader module LM, the load lock chamber LL1 or LL2 and the transfer chamber 110 and processed in the process module to which the wafer W is transferred.

The processing system 100 shown in FIG. 1 includes a control unit Cnt. In an embodiment, the control unit Cnt is a computer including a processor, a memory unit, an input device, a display device, and the like. The control unit Cnt controls each component of the processing system 100. In the control unit Cnt, an operator may perform an input manipulation of a command or the like, using the input device, in order to manage the processing system 100. Further, the display device may visually display an operating situation of the processing system 100. The memory unit of the control unit Cnt stores a control program for allowing a processor to control various processes performed in the processing system 100, or a program, i.e., a processing recipe, for performing the processes of the components of the processing system 100 in accordance with processing conditions.

Figure 2:
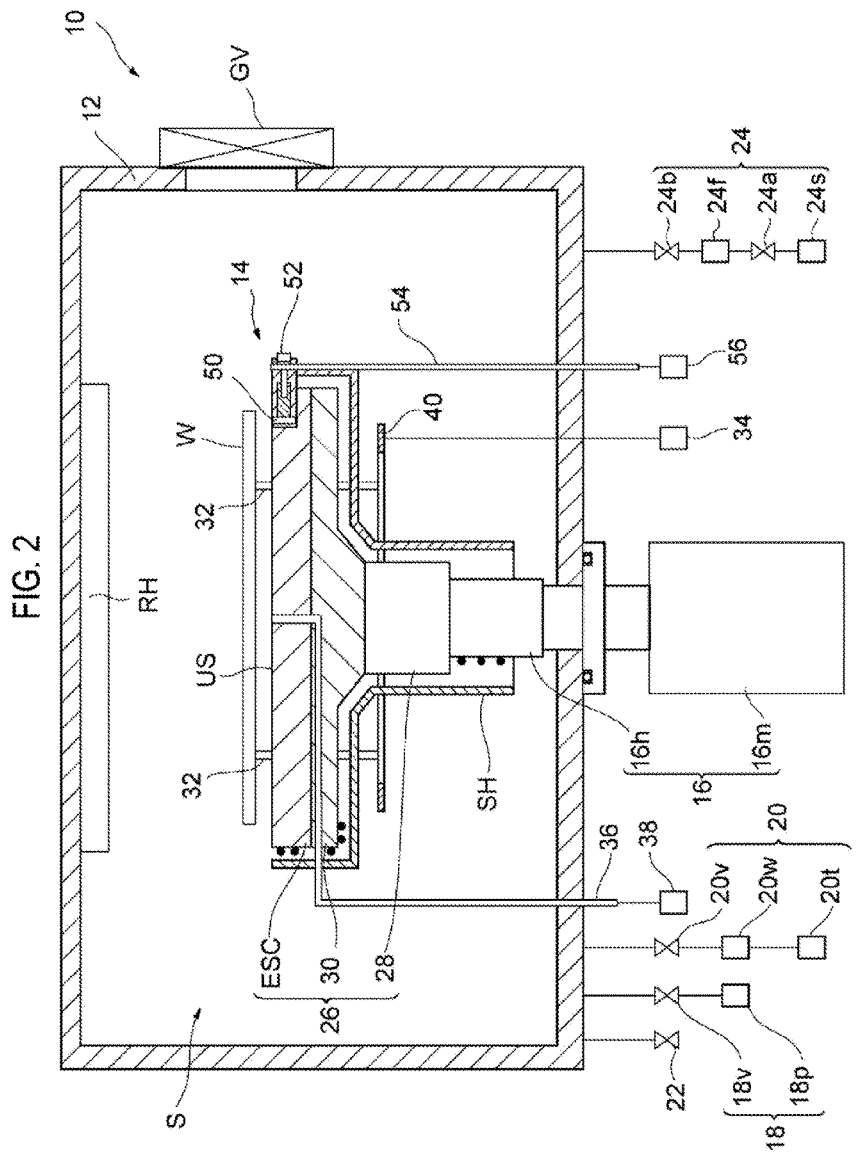
FIG. 2 is a view schematically illustrating a cooling processing apparatus according to an embodiment.

In addition, the processing system 100 includes cooling processing apparatuses according to an embodiment, which are formed as one, two or more process modules among the plurality of process modules PM. FIG. 2 is a view schematically illustrating a cooling processing apparatus according to an embodiment. FIG. 2 schematically shows a vertical sectional structure of the cooling processing apparatus 10 according to the embodiment. In the cooling processing apparatus 10 shown in FIG. 2, the control unit Cnt of the above-described processing system 100 also functions as a control unit of the cooling processing apparatus 10. Thus, the control unit Cnt controls each component of the cooling processing apparatus 10. The cooling processing apparatus 10 includes a processing vessel 12, an electrostatic chuck ESC and a lamp heating device RH. The processing vessel 12 has a generally cylindrical shape and provides a space S therein. The processing vessel 12 has an opening formed therein such that a wafer W is loaded into the space S or unloaded from the space S through the opening. The opening is to be opened/closed by a gate valve GV.

The cooling processing apparatus 10 may also include a first decompressing unit 18, a second decompressing unit 20, a valve 22 and a gas supply unit 24. The first decompressing unit 18 is connected to the processing vessel 12 to decompress the space S. The first decompressing unit 18 has a vacuum pump 18p and a valve 18v. The vacuum pump 18p is connected to the processing vessel 12 through the valve 18v.

The second decompressing unit 20 is connected to the processing vessel 12. The second decompressing unit 20 is installed to cause the pressure in the space S to reach a pressure that is lower than what the first decompressing unit 18 can cause the pressure in the space S to reach. That is, when the space S is decompressed from a state in which the pressure in the space S is an atmospheric pressure, the cooling processing apparatus 10 operates the first decompressing unit 18, thereby continuously operating the second decompressing unit 20. In an embodiment, the second decompressing unit 20 has a turbo molecular pump 20t, a water pump 20w and a valve 20v. The pumps included in the first and second decompressing units 18 and 20 constitute an exhaust device according to an embodiment.

The valve 22 is a valve that is opened when the pressure in the space S in the processing vessel 12 is set to atmospheric pressure. The valve 22 is opened, for example, for maintenance or the like of the cooling processing apparatus 10.

The gas supply unit 24 is installed to supply gas into the processing vessel 12. The gas supply unit 24 supplies gas into the processing vessel 12, for example, when a wafer W is cooled by the cooling processing apparatus 10. The gas supply unit 24 may supply, for example, a rare gas such as Ar gas. For that, the gas supply unit 24 has a gas source 24s, a valve 24a, a flow rate controller 24f such as a mass flow controller, and a valve 24b. The gas source 24s is connected to the processing vessel 12 through the valve 24a, the flow rate controller 24f and the valve 24b.

As shown in FIG. 2, the electrostatic chuck ESC is installed in the processing vessel 12. In an embodiment, the electrostatic chuck ESC constitutes a portion of an electrostatic suction device 14. The electrostatic chuck ESC sucks a wafer W mounted on a top surface thereof, i.e., a mounting surface US, by an electrostatic force. In an embodiment, the electrostatic chuck ESC constitutes a pedestal 26 with first and second support portions 28 and 30. The first support portion 28 has a generally columnar shape, and is made of, for example, a material such as copper (Cu) having high heat conductivity. The second support portion 30 is installed over the first support portion 28. The second support portion 30 is also made of, for example, a material such as copper (Cu) having high heat conductivity. In an example, the second support portion 30 has an upper portion being generally disk shape and a lower portion having a decreasing horizontal cross sectional area along the downward direction. The electrostatic chuck ESC is installed on the second support portion 30.

The cooling processing apparatus 10 further includes a cooler 16 that is a cooling mechanism according to an embodiment. The pedestal 26 is mounted on the cooler 16. The cooler 16 has a cooling head 16h and a main body portion 16m. The cooling head 16h provides a cooling surface, and the cooling surface is in contact with the first support portion 28. The main body portion 16m cools the cooling head 16h with a Gifford-McMahon cycle (G-M cycle) using gas such as helium (He). The cooler 16 has a cooling capacity of cooling the wafer W mounted on the electrostatic chuck ESC to a temperature in the range of −263 degrees C. to −60 degrees C. The lower limit of the temperature in the range is a temperature obtained by adding a temperature increment (e.g., 2 degrees C.) in the wafer W to the lower limit cooling temperature of the cooler 16 itself. The upper limit (−60 degrees C.) of the temperature in the range is a temperature lower than a feasible lower limit temperature by using a general coolant such as Galden (registered trademark). If an adhesive and a vacuum seal are used at a portion cooled to a temperature less than or equal to the upper limit, the adhesive and the vacuum seal may be embrittled at this temperature. The cooler 16 is not limited to the cooler using the G-M cycle as long as it can cool the wafer W to a temperature in the above-described temperature range. The cooling mechanism is also not limited to the cooler and may be any cooling mechanism as long as it cools the electrostatic chuck ESC and the wafer W can be cooled accordingly.

As shown in FIG. 2, the cooling processing apparatus 10 further includes lifter pins 32, a driving device 34, a gas line 36 for a backside gas, and a gas supply unit 38 for a backside gas. In an example, the cooling processing apparatus 10 has three lifter pins 32, each of which is inserted in a hole vertically penetrating through the pedestal 26. The three lifter pins 32 are approximately equidistantly arranged in the circumferential direction about the center of the pedestal 26. The lifter pins 32 are connected to the driving device 34 through a link 40. The driving device 34 vertically moves the lifter pins 32. The lifter pins 32 move upward when a wafer W is loaded into the processing vessel 12 and when the wafer W is unloaded from the processing vessel 12. Therefore, the leading ends of the lifter pins 32 are in a state where they protrude upward from the electrostatic chuck ESC. In this state, the wafer W is transferred to the leading ends of the lifter pins 32 from the above-described transfer unit TU2. Otherwise, the wafer W supported by the leading ends of the lifter pins 32 is received by the transfer unit TU2. Meanwhile, if the lifter pins 32 move downward, the wafer W supported by the leading ends of the lifter pins 32 is mounted on the mounting surface US of the electrostatic chuck ESC.

The gas line 36 extends into the processing vessel 12 from the outside of the processing vessel 12. Further, the gas line 36 passes through the inside of the pedestal 26 from a lateral side of the pedestal 26 and then extends up to the mounting surface US of the electrostatic chuck ESC. The gas line 36 is connected to the gas supply unit 38. The gas supply unit 38 supplies a backside gas for heat transfer, e.g., He gas, to the gas line 36. The gas supplied to the gas line 36 is supplied between the wafer W and the mounting surface US of the electrostatic chuck ESC, i.e., a second insulating layer which will be described later.

Figure 3:
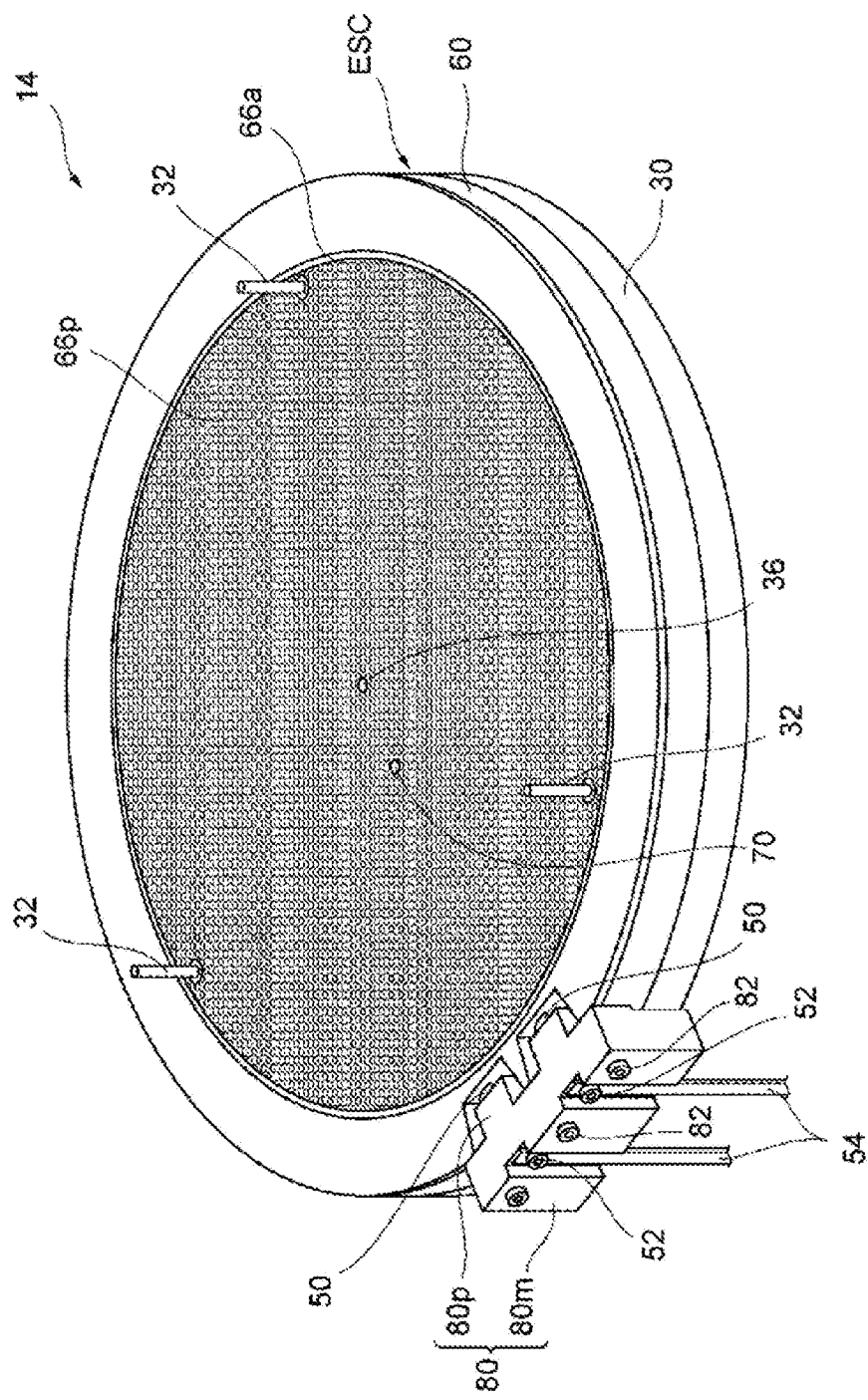
FIG. 3 is a perspective view of an electrostatic suction device according to an embodiment.
Figure 4:
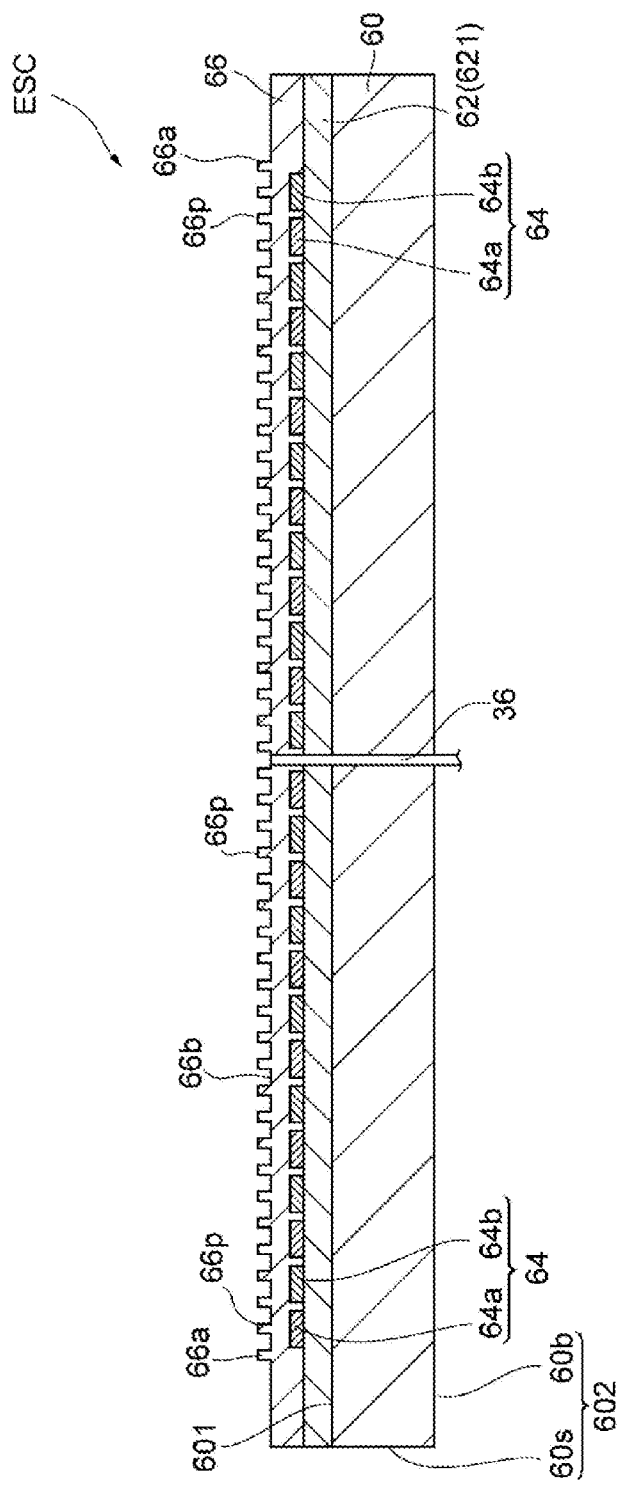
FIG. 4 is a sectional view of an electrostatic chuck according to an embodiment.
Figure 5:
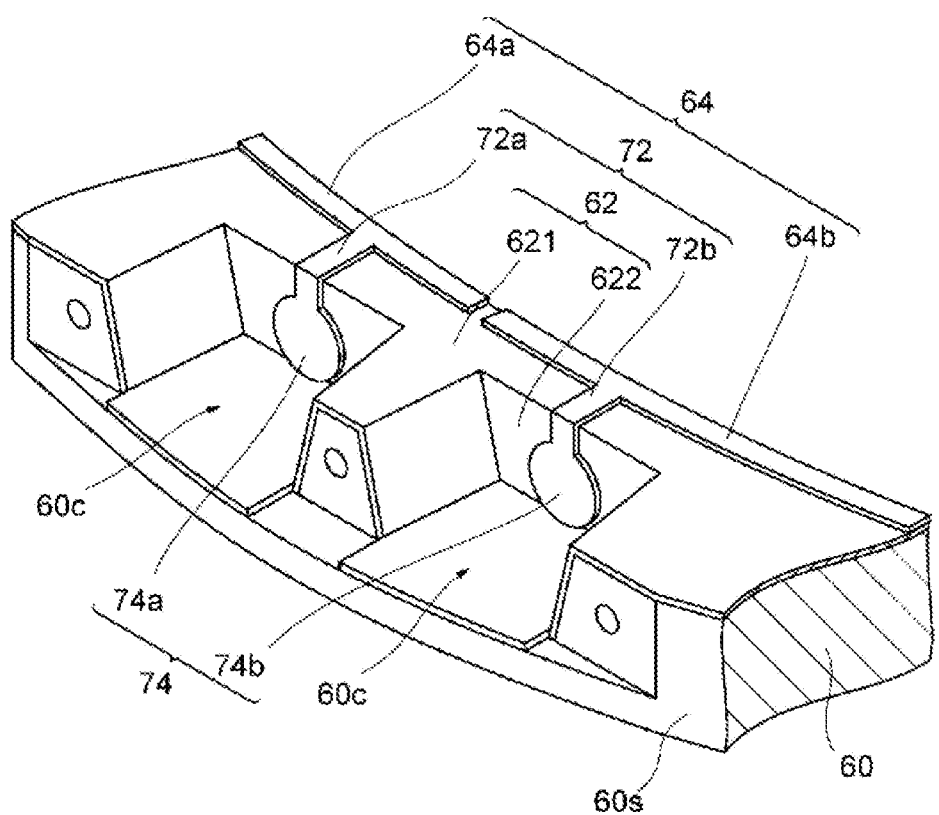
FIG. 5 is an enlarged perspective view illustrating a region including feed terminals of the electrostatic chuck according to an embodiment.
Figure 6:
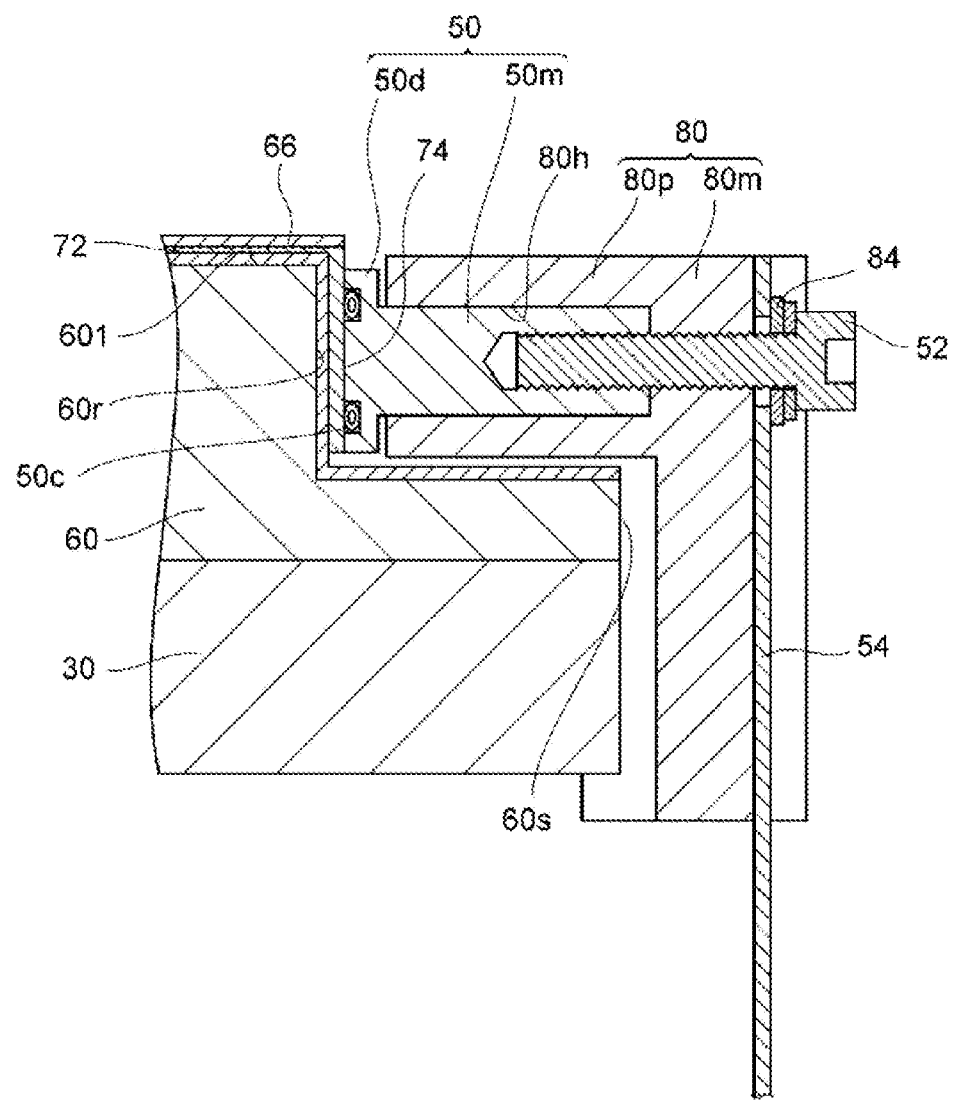
FIG. 6 is an enlarged sectional view illustrating a region of the electrostatic suction device according to an embodiment.

Hereinafter, the electrostatic suction device 14 according to an embodiment will be described in detail with reference to FIGS. 3, 4, 5 and 6 in conjunction with FIG. 2. FIG. 3 is a perspective view of the electrostatic suction device 14 according to an embodiment. FIG. 4 is a sectional view of the electrostatic chuck ESC according to an embodiment. FIG. 5 is an enlarged perspective view illustrating a region including feed terminals of the electrostatic chuck ESC according to an embodiment. In FIG. 5, a second insulating layer which will be described later is omitted. FIG. 6 is an enlarged sectional view illustrating a portion of the electrostatic suction device 14 according to an embodiment, which shows a region related to the electrical connection between a feed terminal and a wire.

As shown in FIGS. 2 and 3, the electrostatic suction device 14 includes the electrostatic chuck ESC, terminal members 50, screws 52, wires 54 and a power source 56. The electrostatic chuck ESC, as shown in FIGS. 3 and 4, has a base 60, a first insulating layer 62, suction electrodes 64 and a second insulating layer 66.

The base 60 is representatively made of a metal, e.g., copper (Cu) or aluminum (Al), and is generally disk shaped. In addition to the metal, the base 60 may be made of ceramic or the like. As shown in FIG. 4, the base 60 has a first surface 601 and a second surface 602 as surfaces thereof. The first surface 601 is a top surface of the base 60, which is a generally circular-shaped flat plane. The second surface 602 is a surface of the base 60 other than the first surface 601. In an example, the second surface 602 includes a side surface 60s of the base 60 and a bottom surface 60b of the base 60. The side surface 60s extends in the direction intersecting or perpendicular to the first surface 601, and the bottom surface 60b is opposite to the first surface 601.

The first insulating layer 62 is provided on the base 60. The first insulating layer 62 is made of an insulator, e.g., alumina ($Al_2O_3$) or aluminum nitride (AlN). The first insulating layer 62 may be formed by spraying an insulator on the base 60.

As shown in FIGS. 4 and 5, the first insulating layer 62 includes a first portion 621 and a second portion 622. The first portion 621 extends on the first surface 601 of the base 60. The second portion 622 continuously extends from the first portion 621 up to the top of a portion of the second surface 602. The second portion 622 of the first insulating layer 62 will be described in detail later.

The suction electrodes 64 are provided on the first portion 621 of the first insulating layer 62. That is, the suction electrodes 64 are provided on the first surface 601 via the first portion 621 of the first insulating layer 62. In an example, the electrostatic chuck ESC is a bipolar type electrostatic chuck and, as shown in FIGS. 4 and 5, the suction electrodes 64 includes a first electrode 64a and a second electrode 64b. The first electrode 64a and the second electrode 64b extend in a spiral shape toward the center from an edge of the electrostatic chuck ESC.

The second insulating layer 66 is provided to cover the first portion 621 of the first insulating layer 62 and the suction electrodes 64. The second insulating layer 66 is made of, for example, alumina ($Al_2O_3$) or aluminum nitride (AlN). As shown in FIGS. 3 and 4, the top surface of the second insulating layer 66 constitutes the mounting surface US and includes a bottom surface 66b, a protruding portion 66a and a plurality of protruding portions 66p. The protruding portion 66a and the plurality of protruding portions 66p are formed to protrude upward from the bottom surface 66b. The protruding portion 66a extends annularly in the circumferential direction with respect to the center of the electrostatic chuck ESC. The plurality of protruding portions 66p each have a general column shape and are arranged to be distributed in a region surrounded by the protruding portion 66a. The second insulating layer 66 having the above-described shape may be formed by spraying an insulator on the first portion 621 of the first insulating layer 62 and the suction electrodes 64, and then, by performing a blast process on the insulator layer.

If a wafer W is mounted on the electrostatic chuck ESC, the top end of the protruding portion 66a is brought into contact with an edge region of a back side of the wafer W and the top ends of the projection portions 66p are brought into contact with the back side of the wafer W. If the wafer W is mounted on the electrostatic chuck ESC to be in contact with the top ends of the protruding portions 66a and 66p, a space is defined between the bottom surface 66b of the second insulating layer 66 and the back side of the wafer W. A back side gas is supplied to the space from the gas line 36 shown in FIG. 3. The gas supplied to the space is collected by a gas line 70 installed to penetrate through the pedestal 26.

In an embodiment, as shown in FIGS. 5 and 6, concave portions 60c are formed in the side surface 60s of the base 60. The second portion 622 of the first insulating layer 62 extends on the surface of the base 60 in which the concave portions 60c are formed. The surface of the base 60 in which the concave portions 60c are formed includes a region 60r, which is not parallel to the first surface 601, i.e., extends in the direction intersecting or perpendicular to the first surface 601. In an embodiment, the region 60r is a surface in which the concave portion 60c is formed from the central side of the electrostatic chuck ESC.

On the second portion 622 of the first insulating layer 62 provided on the region 60r, conductor patterns 72 electrically connected to the suction electrodes 64 are extended. The conductor patterns 72 provide feed terminals 74 on the second portion 622 provided on the region 60r. In an embodiment, the conductor patterns 72 include a first conductor pattern 72a and a second conductor pattern 72b. The feed terminals 74 include a first feed terminal 74a and a second feed terminal 74b. The first conductor pattern 72a is electrically connected to the first electrode 64a. Further, the first conductor pattern 72a provides the first feed terminal 74a on the second portion 622 provided on the region 60r. In addition, the second conductor pattern 72b is electrically connected to the second electrode 64b and provides the second feed terminal 74b on the second portion 622 provided on the region 60r. Two wires 54 connected to the power source 56 are electrically connected to the first and second feed terminals 74a and 74b, respectively. The power source 56 applies voltages having different potentials to the first and second electrodes 64a and 64b, respectively. Therefore, the electrostatic chuck ESC generates an electrostatic force.

Hereinafter, a configuration for electrical connection between the first feed terminal 74a and the wire 54 and a configuration for electrical connection between the second feed terminal 74b and the wire 54 will be described. The configuration for electrical connection between the first feed terminal 74a and the wire 54 is the same as the configuration for electrical connection between the second feed terminal 74b and the wire 54. Therefore, hereinafter, a configuration for electrical connection between one feed terminal designated by reference numeral "74" and one wire 54 will be described.

As shown in FIGS. 3 and 6, the electrical connection between the feed terminal 74 and the wire 54 is realized by interposing the terminal member 50 between the feed terminal 74 and the wire 54 to make a physical contact between the terminal member 50 and the feed terminal 74. The terminal member 50 includes a main portion 50m and a leading end portion 50d. The main portion 50m is generally column shaped. A screw hole is formed in the main portion 50m. The screw hole extends in the longitudinal direction of the main portion 50m from one end of the main portion 50m. The leading end portion 50d is continuous with the main portion 50m at the other end of the main portion 50m. The leading end portion 50d is generally disk shaped. The leading end portion 50d provides a contact portion 50c. In an embodiment, an annularly extending groove is formed in the leading end portion 50d. The groove has a spring made of a conductor accommodated therein. The spring is, for example, a coil-shaped spring. In an embodiment, the spring constitutes the contact portion 50c and physically contacts with the feed terminal 74.

The contact portion 50c of the terminal member 50 is configured to be biased (or urged) against the feed terminal 74 by the screw 52. In an embodiment, the screw 52 is a screw made of a conductor. The screw 52 is supported by an insulative support member 80. The support member 80 includes a main portion 80m and a protruding portion 80p. The main portion 80m extends along the side surface 60s of the base 60 and a side surface of the second support portion 30. A through-hole is formed in the main portion 80m. Also, a screw hole is formed in the base 60 such that the screw hole continuously extends to the through-hole of the main portion 80m. The screw 52 is threadedly coupled to the screw hole, so that the support member 80 is fixed to the base 60.

The protruding portion 80p of the support member 80 extends to protrude from the main portion 80m. The protruding portion 80p of the support member 80 is inserted into the concave portion 60c of the base 60. The protruding portion 80p provides a hole 80h into which the main portion 50m of the terminal member 50 is inserted. A through-hole is formed in the main portion 80m of the support member 80 to be continuous with the hole 80h. The screw 52 is threadedly coupled to the screw hole of the main portion 50*m* of the terminal member 50 through the through-hole, so that the contact portion 50*c* is biased against the feed terminal 74.

As shown in FIGS. 3 and 6, the wire 54 is installed along the main portion 80*m* of the support member 80. A hole through which the screw 52 passes is formed in the wire 54. Also, the wire 54 is inserted and supported between the main portion 80*m* and a head portion of the screw 52. Accordingly, the wire 54 and the screw 52 are in electrical conduction with each other, and the screw 52 and the terminal member 50 are in electrical conduction with each other. As a result, an electrical connection between the wire 54 and the feed terminal 74 is realized. In an embodiment, a washer 84 made of a conductor may be provided between the head portion of the screw 52 and the wire 54.

In the electrostatic suction device 14 described above, the feed terminal 74 is in contact with the contact portion 50*c* of the terminal member 50. The contact portion 50*c* of the terminal member 50 is also biased against the feed terminal 74 by the screw 52 (which is sometimes referred to as a "biasing part 52"). Thus, in the electrostatic suction device 14, it is possible to ensure the electrical connection between the feed terminal 74 and the wire 54 without using the adhesive and the vacuum seal at the portion related to the electrical connection between the feed terminal 74 and the wire 54. Accordingly, it is possible to ensure the reliability of the connection between the feed terminal 74 and the wire 54 even under an extremely-low temperature environment. Further, in the electrostatic suction device 14, the feed terminal 74 is provided on the second portion 622 of the first insulating layer 62 provided on the second surface 602 of the base 60. Thus, it is possible to suppress the breakdown of the electrostatic chuck ESC due to the pressurization of the biasing part 52.

Further, in an embodiment, the basing part is configured as the screw 52, and the screw 52 is supported by the insulative support member 80. In this embodiment, it is possible to realize the biasing part having a simple configuration.

In an embodiment, the contact portion 50*c* of the terminal member 50 is configured as a conductive spring. According to this embodiment, the reliability of the physical contact between the contact portion 50*c* of the terminal member 50 and the feed terminal 74 is further improved.

Reference will be made to FIG. 2 again. As shown in FIG. 2, the cooling processing apparatus 10 includes the lamp heating device RH. The lamp heating device RH is a lamp heating device that emits radiation light for heating, such as infrared light. The lamp heating device RH is provided to remove moisture attached to the electrostatic chuck ESC, particularly moisture attached to the mounting surface US of the electrostatic chuck ESC. The mounting surface US of the electrostatic chuck ESC is heated by the lamp heating device RH, so that it is possible to evaporate the moisture attached to the mounting surface US of the electrostatic chuck ESC. As a result, it is possible to prevent the suction force of the electrostatic chuck ESC from being lowered. Further, it is possible to suppress the occurrence of discharge due to penetration of moisture into the electrostatic chuck ESC.

In an embodiment, the cooling processing apparatus 10 further includes a shield member SH. The shield member SH is made of a metal such as aluminum or stainless steel. The shield member SH is provided along the surface of the electrostatic chuck ESC other than the mounting surface US. Specifically, the shield member SH has a generally cylindrical shape at an upper portion thereof and extends along the side surface of the electrostatic chuck ESC. In an embodiment, the shield member SH also extends along the surfaces of the first and second support portions 28 and 30. Also, the shield member SH extends along the surface of the cooling head 16*h*. In this embodiment, the shield member SH includes an upper portion having a generally cylindrical shape extending along the side surface of the electrostatic chuck ESC and the side surface of the second support portion, a middle portion having a generally annular plate shape extending inward toward the side surface of the first support portion 28, and a lower portion having a generally cylindrical shape extending along the first support portion 28 and the cooling head 16*h*. The shield member SH is spaced apart from the surface of the electrostatic chuck ESC, for example, with a gap of not more than 10 mm.

In the cooling processing apparatus 10 having the shield member SH, most of the moisture existing between the shield member SH and the electrostatic chuck ESC is reflected on the shield member SH to be attached to the surface (side surface) of the cooled electrostatic chuck ESC. Thus, the moisture existing between the shield member SH and the electrostatic chuck ESC is prevented from reaching the mounting surface US of the electrostatic chuck ESC, as indicated by a black circle in FIG. 2

Hereinafter, application examples of the cooling processing apparatus 10 and the processing system 100 having the cooling processing apparatus 10 as a process module will be described. In one application example, the processing system 100 is used in manufacturing a magnetic tunnel junction (MTJ) device constituting a magnetoresistive random access memory (MRAM).

Figure 7:
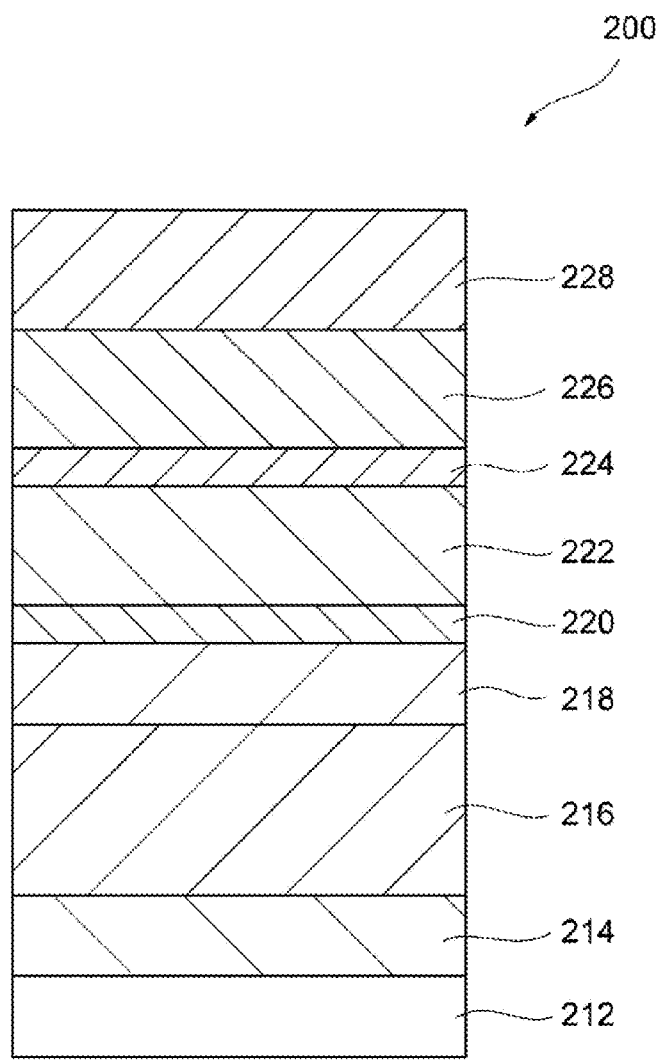
FIG. 7 is a sectional view illustrating an example of an MJT device.

FIG. 7 is a sectional view illustrating an example of an MJT device. The MTJ device 200 shown in FIG. 7 includes a first magnetic layer 222, a second magnetic layer 226 and a tunnel insulating layer 224. The tunnel insulating layer 224 is provided between the first and second magnetic layers 222 and 226. The first and second magnetic layers 222 and 226 may be, for example, magnetic metal layers such as a Co—Fe—B layer. The tunnel insulating layer 224 may be, for example, a metal oxide layer such as a magnesium oxide layer, an aluminum oxide layer or a titanium oxide layer.

The MTJ device 200 may also include a lower electrode layer 212, an underlayer 214, an antiferromagnetic layer 216, a magnetic layer 218, a magnetic layer 220 and a cap layer 228. The underlayer 214 is provided on the lower electrode layer 212. The antiferromagnetic layer 216 is provided on the underlayer 214. The magnetic layer 218 is provided on the antiferromagnetic layer 216. The magnetic layer 220 is provided on the magnetic layer 218. A first magnetic layer 222 is provided on the magnetic layer 220. The cap layer 228 is provided on the second magnetic layer 226. In an example, the lower electrode layer 212 is a Ru layer, and the underlayer 214 is a Ta layer. The antiferromagnetic layer 216 is a Mn—Pt layer, and the magnetic layer 218 is a Co—Fe layer. The magnetic layer 220 is a Ru layer, and the cap layer 228 is a Ta layer.

The cooling processing apparatus 10 may be used, for example, before or when the second magnetic layer 226 of the MTJ device 200 is formed. If a wafer W having the MTJ device 200 formed thereon is cooled using the cooling processing apparatus 10 before or when the second magnetic layer 226 as a CoFeB layer is formed, it is possible to form the second magnetic layer 226 having excellent film quality. In addition, when the cooling processing apparatus 10 is used in film formation, the cooling processing apparatus 10 is configured as a physical vapor growth apparatus. In this case, the cooling processing apparatus 10 becomes an apparatus further including a target, a target holder, electrodes for generating plasma, a power source for supplying power to the electrodes, and the like.

Figure 8:
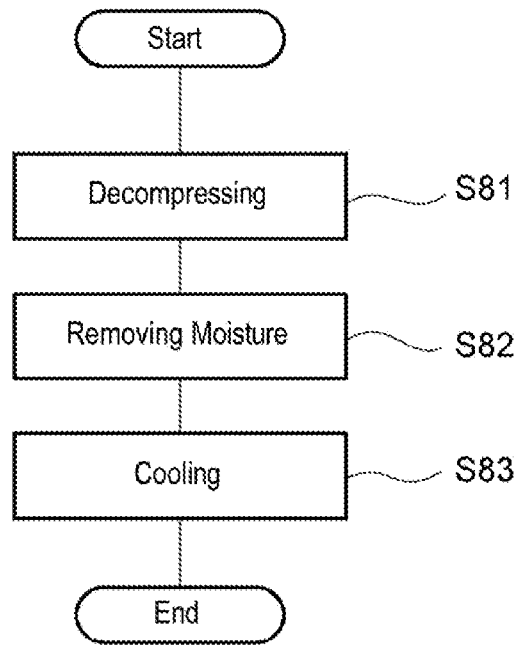
FIG. 8 is a flowchart illustrating an embodiment of a method for operating the cooling processing apparatus.

Hereinafter, a method for operating the cooling processing apparatus 10 will be described, and the control of the control unit Cnt for performing the method will be described. FIG. 8 is a flowchart illustrating an embodiment of a method for operating the cooling processing apparatus 10. The operation method shown in FIG. 8 is used, for example, when the cooling processing apparatus 10 is repaired in a state in which the space S in the processing vessel 12 is opened in the atmosphere and then again operates the cooling processing apparatus 10 to cool a wafer W.

In the method shown in FIG. 8, Step S81 is performed after the above-described repair is performed. In Step S81, the space S in the processing vessel 12 is decompressed by the first and second decompressing units 18 and 20. In Step S81, the control unit Cnt may control the first and second decompressing units 18 and 20 to decompress the space S in the processing vessel 12.

Continuously, in Step S82, heating is performed by the lamp heating device RH, so that moisture attached on the mounting surface US of the electrostatic chuck ESC is removed. In Step S82, the control unit Cnt may control the lamp heating device RH to operate the lamp heating device RH.

Continuously, after the removal of the moisture performed by the lamp heating device RH is terminated, in Step S83, the electrostatic chuck ESC is cooled by the cooler 16. In Step S83, the control unit Cnt may control the cooler 16 to operate the cooler 16. After Step S83, a wafer W in the processing vessel 12 of the cooling processing apparatus 10 is transferred and mounted on the mounting surface US of the electrostatic chuck ESC, thereby cooling the wafer W.

If the cooling processing apparatus 10 is repaired after the space S in the processing vessel 12 is opened to the atmosphere, moisture exists in the space S in the processing vessel 12 and on the electrostatic chuck ESC. Therefore, a considerable time is required to remove the moisture only by decompressing the space S in the processing vessel 12. However, according to the method shown in FIG. 8, since the mounting surface US is heated by the lamp heating device RH in Step S82, it is possible to reduce the time required to remove the moisture attached to the mounting surface US.

Figure 9:
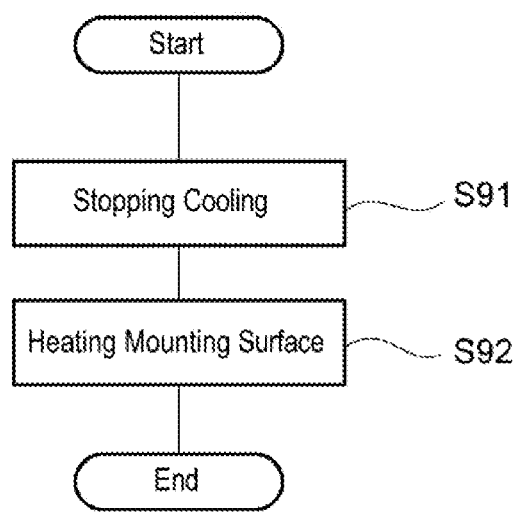
FIG. 9 is a flowchart illustrating another embodiment of the method for operating the cooling processing apparatus.

Hereinafter, another method for operating the cooling processing apparatus 10 will be described. FIG. 9 is a flowchart illustrating another embodiment of the method for operating the cooling processing apparatus. In the method shown in FIG. 9, in Step S91, the cooler 16 is first stopped with the decompressed space S in the processing vessel 12. In Step S91, the control unit Cnt may control the cooler 16 to stop the cooler 16. Continuously, in Step S92, the mounting surface US is heated by the lamp heating device RH. In Step S92, the control unit Cnt may control the lamp heating device RH to operate the lamp heating device RH. The method of this embodiment can be used to remove moisture attached to the mounting surface US, for example, after a wafer W is processed in the cooling processing apparatus 10 and then before another wafer W is processed in the cooling processing apparatus 10. Further, under a decompressed environment, the mounting surface US is heated to, for example, a temperature of about −230 degrees C., so that the moisture attached to the mounting surface US can be efficiently sublimed.

Figure 10:
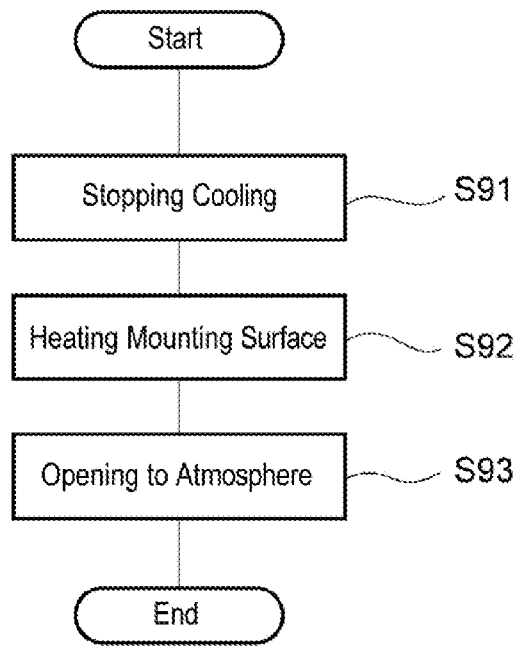
FIG. 10 is a flowchart illustrating still another embodiment of the method for operating the cooling processing apparatus.

FIG. 10 is a flowchart illustrating still another embodiment of the method for operating the cooling processing apparatus 10. The operation method shown in FIG. 10 is a method that may be used when the space S in the processing vessel 12 is opened to the atmosphere before the cooling processing apparatus 10 is repaired, or the like. Further, the operation method shown in FIG. 10 includes Step S93 performed after Step S92 is performed, in addition to Steps S91 and S92 in the method of FIG. 9.

In Step S93, the valve 22 is opened. Therefore, the space S in the processing vessel 12 is opened to the atmosphere. In Step S93, the control unit Cnt may control the valve 22 to open the valve 22.

If the temperature of the electrostatic chuck ESC is maintained in a low temperature state when the space S in the processing vessel 12 is opened to the atmosphere, a considerable amount of moisture may be attached to the surface of the electrostatic chuck ESC. In addition, a considerable amount of time is required to increase the temperature of the electrostatic chuck ESC from the low temperature state. However, according to the operation method shown in FIG. 10, since the mounting surface US can be heated by the lamp heating device RH, it is possible to suppress the attachment of the moisture to the mounting surface US. Further, it is possible to reduce the time required to increase the temperature of the mounting surface US.

Figure 11:
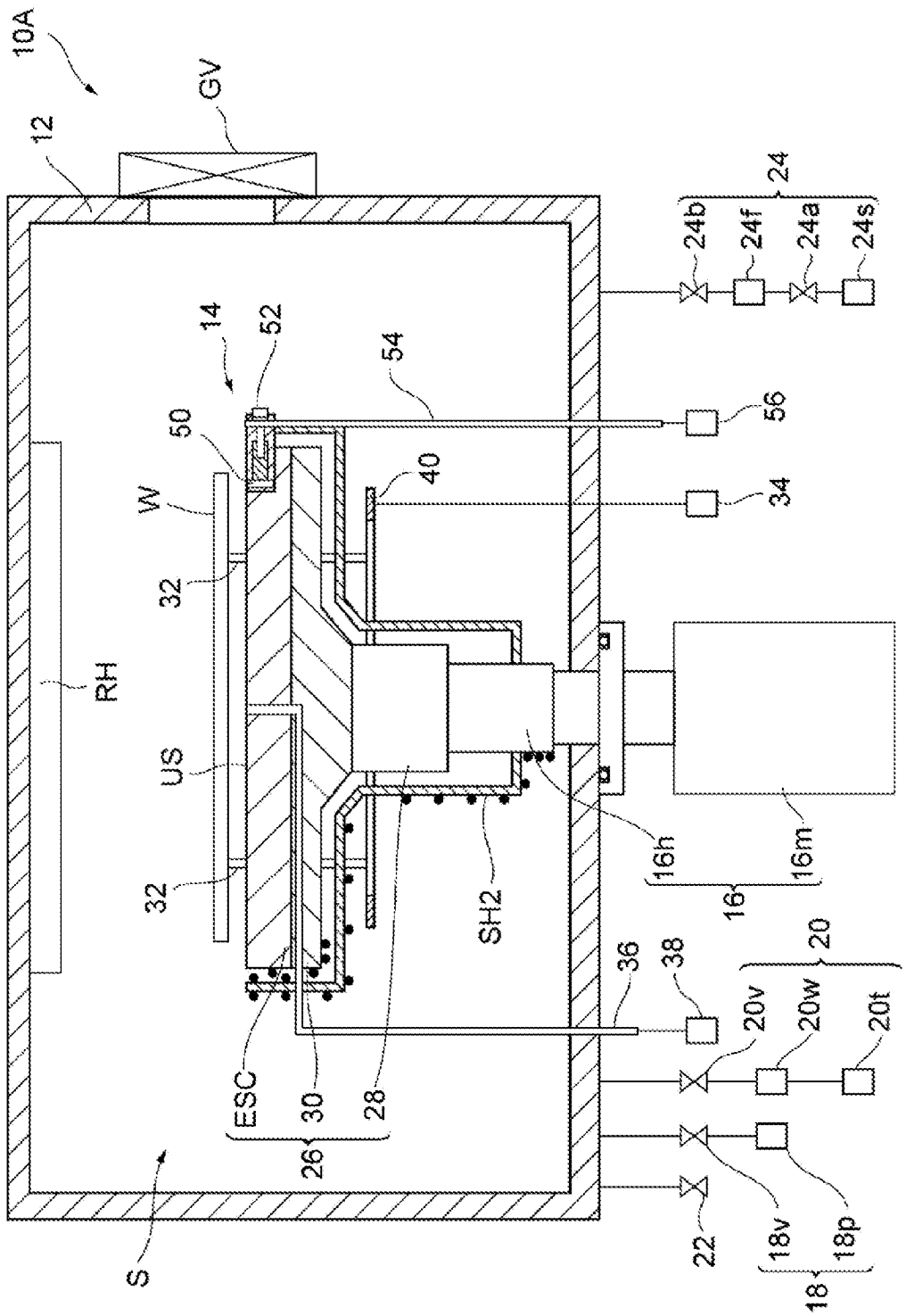
FIG. 11 is a view schematically illustrating a cooling processing apparatus according to another embodiment.

Hereinafter, a cooling processing apparatus according to another embodiment will be described with reference to FIG. 11. A cooling processing apparatus 10A shown in FIG. 11 may be used as a process module PM of the processing system 100 instead of the cooling processing apparatus 10. The cooling processing apparatus 10A may be operated based on the operation method of the above-described embodiment.

The cooling processing apparatus 10A includes a shield member SH2, instead of the shield member SH. The shield member SH2 is in contact with the cooling head 16h of the cooler 16 at a lower portion thereof. Otherwise, the cooling processing apparatus 10A has the same configuration as the cooling processing apparatus 10.

The cooling processing apparatus 10A is configured so that the cooler 16 also cools the shield member SH2 in addition to the electrostatic chuck ESC. Thus, in the cooling processing apparatus 10A, moisture existing in the space S in the processing vessel 12 is attached to the shield member SH2. Hence, it is possible to prevent the moisture from being attached to the mounting surface US of the electrostatic chuck ESC. Further, moisture existing between the shield member SH2 and the electrostatic chuck ESC is also attached to surfaces (side surface) other than the shield member SH2 or the mounting surface US of the electrostatic chuck ESC. Thus, it is possible to prevent the moisture from being attached to the mounting surface US of the electrostatic chuck ESC.

While various embodiments have been described above, the present disclosure is not limited to the above-described embodiments, and various modifications may be made. For example, the feed terminals 74 may be formed on another surface of the base 60 opposite the first surface 601 of the base 60. The electrostatic chuck ESC of the above-described embodiment is a bipolar type electrostatic chuck, but may be a monopolar type electrostatic chuck in a modification. The configuration for feeding power to the suction electrodes 64 of the electrostatic chuck ESC is not limited to the configuration of the above-described embodiment, and may be realized by any configuration. In the above-described application example, the cooling processing apparatus 10 is mainly used before or when the second magnetic layer 226 is formed. However, the cooling processing apparatus 10 may be used before or when another layer of the MTJ device 200 is formed. Alternatively, the cooling processing apparatus 10 may be used in a process of manufacturing a device different from the MTJ device.

As described above, it is possible to reduce moisture attached to the mounting surface of the electrostatic chuck.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cooling processing apparatus, comprising:
    a processing vessel;
    an electrostatic chuck installed in the processing vessel, the electrostatic chuck having a mounting surface on which an object to be processed is mounted;
    a support portion on which the electrostatic chuck is installed;
    a cooling mechanism configured to cool the electrostatic chuck, the cooling mechanism having a cooling surface in contact with the support portion;
    a lamp heating device configured to remove moisture attached to the mounting surface, the lamp heating device being arranged to heat the mounting surface of the electrostatic chuck; and
    a shield member made of a metal, the shield member extending along a surface other than the mounting surface of the electrostatic chuck, a surface of the support portion, and a surface of the cooling mechanism.

2. The cooling processing apparatus of claim 1, wherein the cooling mechanism cools the shield member in addition to the electrostatic chuck.

3. The cooling processing apparatus of claim 2, wherein the shield member is in contact with the cooling mechanism.

4. The cooling processing apparatus of claim 1, further comprising:
    an exhaust device configured to decompress a space in the processing vessel; and
    a valve configured to open the space in the processing vessel to the atmosphere.

5. The cooling processing apparatus of claim 4, further comprising a control unit configured to control the lamp heating device, the cooling mechanism and the exhaust device, wherein the control unit controls the exhaust device to decompress the space in the processing vessel, controls the lamp heating device to remove the moisture attached to the mounting surface of the electrostatic chuck, and controls the cooling mechanism to cool the electrostatic chuck after the removal of the moisture performed by the lamp heating device is terminated.

6. The cooling processing apparatus of claim 4, further comprising a control unit configured to control the lamp heating device and the cooling mechanism, wherein the control unit controls the cooling mechanism to stop the cooling performed by the cooling mechanism in the state in which the space in the processing vessel is decompressed by the exhaust device, and controls the lamp heating device to heat the mounting surface of the electrostatic chuck after the cooling performed by the cooling mechanism is stopped.

7. The cooling processing apparatus of claim 6, wherein the control unit controls the lamp heating device and then controls the valve to open the space in the processing vessel to the atmosphere.

8. The cooling processing apparatus of claim 1, wherein the cooling mechanism comprises a cooler.

9. A method for operating the cooling processing apparatus of claim 4, the method comprising:
    decompressing the space in the processing vessel by using the exhaust device;
    removing the moisture attached to the mounting surface of the electrostatic chuck by using the lamp heating device; and
    cooling the electrostatic chuck by using the cooling mechanism after the removal of the moisture performed by the lamp heating device is terminated.

10. A method for operating the cooling processing apparatus of claim 4, the method comprising:
    stopping the cooling performed by the cooling mechanism in the state in which the space in the processing vessel is decompressed by the exhaust device; and
    heating the mounting surface of the electrostatic chuck by using the lamp heating device after the cooling performed by the cooling mechanism is stopped.

11. The method of claim 10, further comprising opening the valve to open the space in the processing vessel to the atmosphere after the heating of the mounting surface is performed.

* * * * *